US008179180B2

(12) United States Patent
Genschow

(10) Patent No.: US 8,179,180 B2
(45) Date of Patent: May 15, 2012

(54) DEVICE AND METHOD FOR DETECTING AN APPROACH OR CONTACT

(75) Inventor: Dieter Genschow, Berlin (DE)

(73) Assignee: PRETTL Home Appliance Solutions GmbH, Neuruppin (DE)

( * ) Notice: Subject to any disclaimer, the term of this patent is extended or adjusted under 35 U.S.C. 154(b) by 0 days.

(21) Appl. No.: 12/802,796

(22) Filed: Jun. 14, 2010

(65) Prior Publication Data

US 2011/0001548 A1   Jan. 6, 2011

Related U.S. Application Data

(63) Continuation of application No. PCT/EP2008/010618, filed on Dec. 12, 2008.

(30) Foreign Application Priority Data

Dec. 14, 2007   (DE) .......... 10 2007 062 263

(51) Int. Cl.
*H03H 11/16* (2006.01)
*H03K 5/13* (2006.01)

(52) U.S. Cl. ........ 327/269; 327/263; 327/271; 327/272; 327/517

(58) Field of Classification Search .......... 327/261–264, 327/269, 270, 276–278
See application file for complete search history.

(56) References Cited

U.S. PATENT DOCUMENTS

| | | | |
|---|---|---|---|
| 4,160,173 A | | 7/1979 | Aoki |
| 4,484,091 A | * | 11/1984 | Nagano .......... 326/52 |
| 5,604,455 A | * | 2/1997 | Bion et al. .......... 327/176 |
| 5,917,165 A | * | 6/1999 | Platt et al. .......... 200/600 |
| 2004/0084970 A1 | | 5/2004 | Winkler et al. |
| 2006/0109146 A1 | * | 5/2006 | Takahashi et al. .......... 341/50 |
| 2007/0124632 A1 | | 5/2007 | Chung et al. |

FOREIGN PATENT DOCUMENTS

| | | |
|---|---|---|
| DE | 80 33 570 U1 | 5/1982 |
| DE | 698 24 488 T2 | 8/2005 |

(Continued)

OTHER PUBLICATIONS

PCT Application No. PCT/EP2008/010618, International Search Report and Written Opinion dated Feb. 6, 2009.

(Continued)

*Primary Examiner* — Lincoln Donovan
*Assistant Examiner* — Brandon s Cole
(74) *Attorney, Agent, or Firm* — Larry E. Henneman, Jr.; Henneman & Associates, PLC

(57) ABSTRACT

A device for detecting an approach or a touch related to at least one sensor element, in particular in an electrical appliance, the device comprising an input side and an output side, between which a first signal path with a first input and a first output and a second signal path with a second input and a second output are arranged, wherein the first signal path comprises a delay device with a delay, the delay device configured to delay a digital first input signal at the first input into a digital first output signal at the first output, wherein the delay is dependent on a capacitance value resulting from the approach or the touch related to the sensor element, and wherein the second signal path comprises an XOR-element, which is configured to generate an edge in a digital second output signal at the second output, when the digital first output signal outputted by the delay device exhibits an edge.

29 Claims, 4 Drawing Sheets

| | FOREIGN PATENT DOCUMENTS | | |
|---|---|---|---|
| DE | 10 2004 038872 A1 | | 3/2006 |
| GB | 2114751 A | | 8/1983 |
| JP | 56184121 | * | 11/1981 |
| JP | 58-085637 A | | 5/1983 |

OTHER PUBLICATIONS

PCT Application No. PCT/EP2008/010618, International Preliminary Report on Patentability dated Jul. 15, 2010.

* cited by examiner

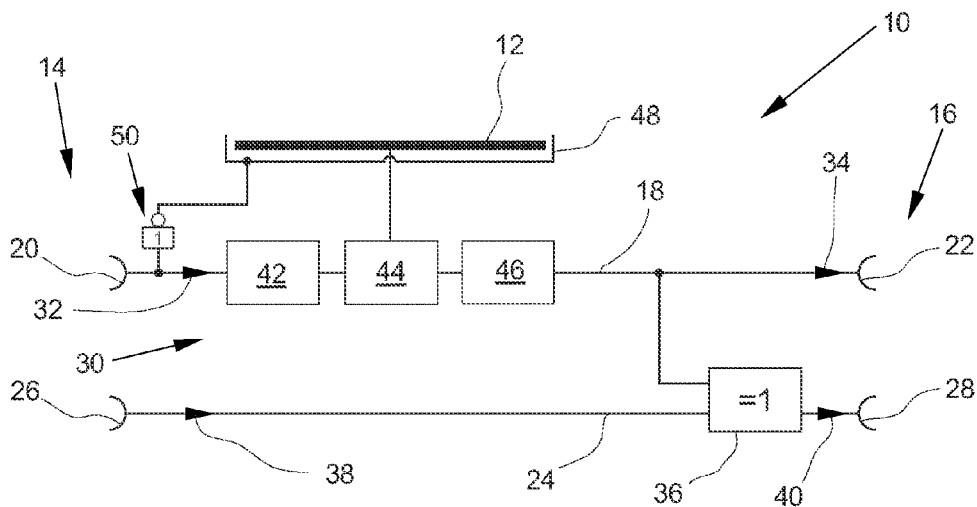
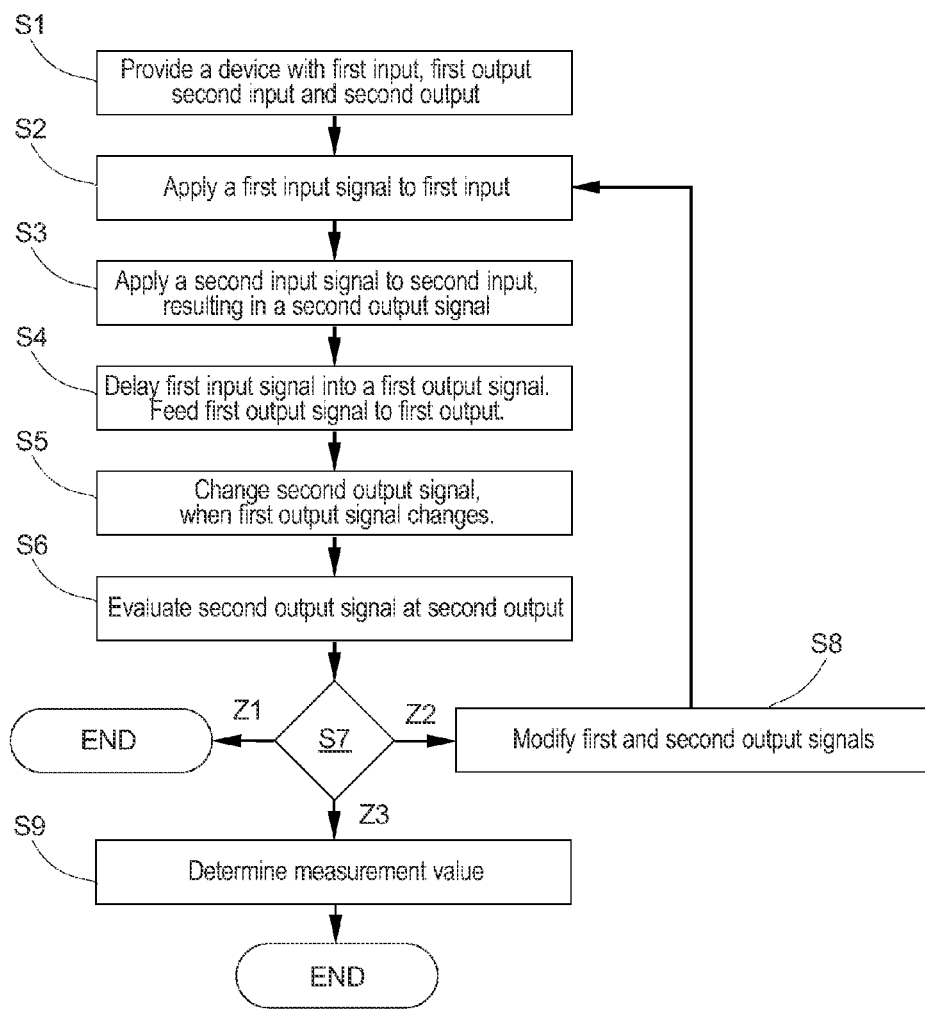
Fig. 1
Fig. 2

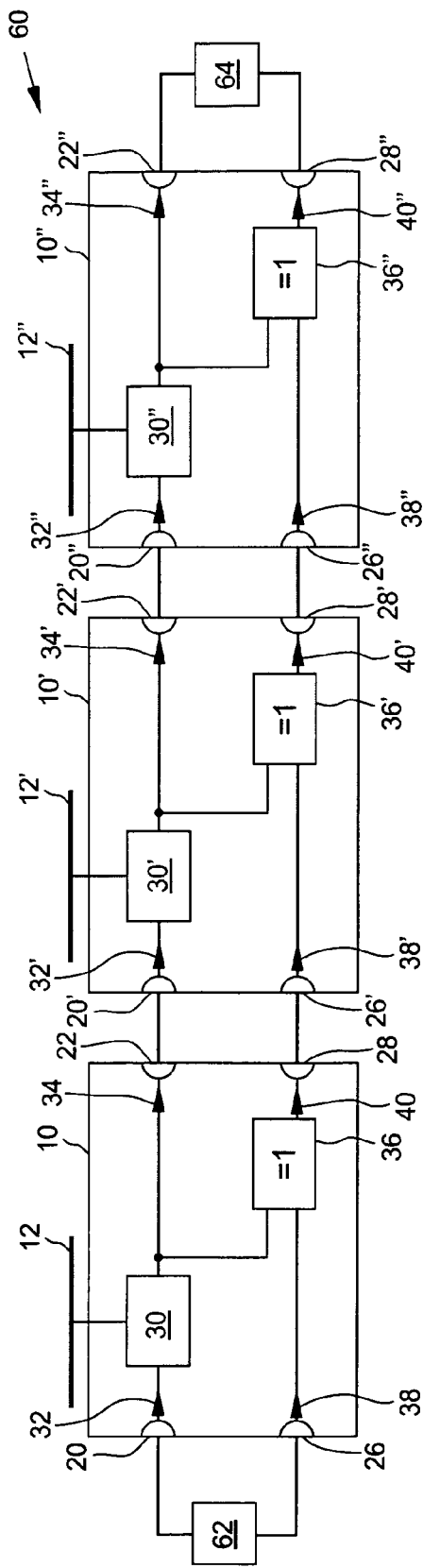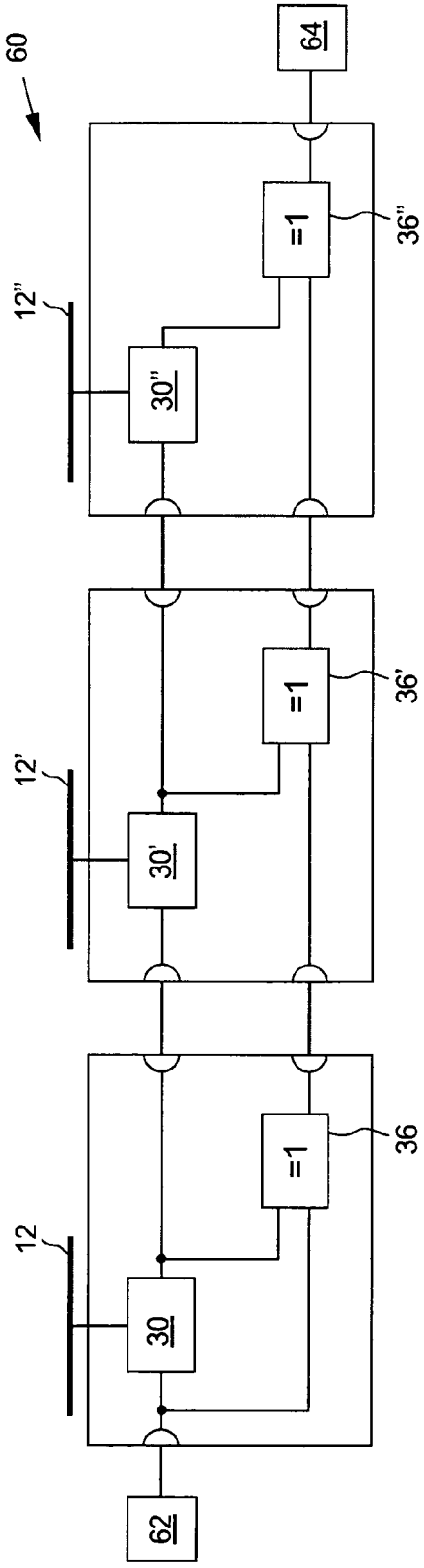

$t_0=0$ $t_1=s$ $t_2=t_1+v$ $t_3=t_2+v+d_1$ $t_4=t_3+v+d_2$

DEVICE AND METHOD FOR DETECTING AN APPROACH OR CONTACT

CROSS REFERENCES TO RELATED APPLICATIONS

This application is a continuation of International Patent Application PCT/EP2008/010618 filed on Dec. 12, 2008, designating the U.S., which International Patent Application has been published in German language and claims priority from German Patent Application DE 10 2007 062 263, filed on Dec. 14, 2007. The entire contents of these priority applications are incorporated herein by reference.

BACKGROUND OF THE INVENTION

The present invention relates to a device and a method for detecting an approach or a touch related to at least one sensor element, in particular for operating an electrical appliance. Further, the present invention relates to a series arrangement of at least two such devices.

Detecting or determining an approach or a touch related to at least one sensor element is of great significance for operating, monitoring and/or controlling an electrical appliance. Among the devices of interest are such devices that allow to determine a position related to areas of a closed surface that are designed to look like keys. In the past, the individual operating elements of an operating panel have been embodied as discrete mechanical or electro-mechanical keys or switches. In order to operate a key, the cover of the operating panel required openings, through which dirt and fluids could enter into the operating panel. One idea was to cover the keys with a layer of rubber, but such layer did not have a sufficient durability and the feel of the surface was not satisfactory.

In order to detect an approach of an object towards a closed surface or a touch of an object on a closed surface, methods based on an electrical principle have been applied. The reasoning is, that a corresponding object, in particular a finger of a human hand, introduces resistive and/or capacitive changes that can be detected and based on which the position of an object can be determined. Quite often the technical concept of a capacitive touch switch has been employed.

The principle of a capacitive touch switch has been known for a long time. For example, in the context of providing operating areas for ceramic stove tops, DE 80 33 570 U1 discloses to provide a large capacitive area at the top surface and two smaller capacitive areas at the back of the ceramic plate. An alternating current is applied to one of the smaller capacitive plates. In the other smaller capacitive plate, another alternating current is detected. If the operating area is touched by a finger, the capacitive arrangement goes off-tune, which can be detected via corresponding electronics and which can be understood as "pressing" the capacitive touch switch.

Document EP 1 416 636 A2 shows another arrangement for a capacitive touch switch, where a body of foamed material comprises electrically conductive areas having a sensor element top surface and isolating areas, which are arranged along the extent of a ceramic plate in an alternating manner. Thereby, a type of "string material" can be produced where capacitive touch switches can be produced that are arranged side by side.

EP 0 859 467 B1 discloses to provide a capacitive touch switch with a sensor key, which acts as one pole of a capacitor, wherein the sensor key is made of a flexible, regionally extending, and electrically conducting material, which is variable in its shape and which is arranged on a printed circuit board and acts as a bridge for the distance between a cover plate and the printed circuit board, wherein a certain compression stress is maintained.

DE 10 2004 038 872 A1 discloses a touch switch for an operating panel of an electric device such as a stove top. The switch comprises a sensor element with two sensor areas, which again comprise one or more triangle-shaped sub-areas. Control signals are applied to the sensor areas and are partially uncoupled, when a touch with a finger occurs, corresponding to the amount of the area covered by the finger. The remaining signal is fed into a microcontroller for comparison, in order to detect the position of the touch as a function of the ratio of the remaining signal strengths and the areas covered.

Against this background, an object of the present invention is to provide an improved device for detecting an approach or a touch related to at least one sensor element, in particular for operating an electric appliance, the device allowing for cost-saving and efficient production in large quantities. It is desired that the use of a plurality of devices, in particular in a series arrangement, can be easily realized. It is a further object to provide a corresponding improved method for detecting an approach or a touch related to at least one sensor element and a corresponding series arrangement.

SUMMARY OF THE INVENTION

According to one aspect of the invention, there is provided a device for detecting an approach or a touch related to at least one sensor element, the device comprising an input side and an output side, between which a first signal path with a first input and a first output and a second signal path with a second input and a second output are arranged, wherein the first signal path comprises a delay device with a delay, the delay device configured to delay a first input signal at the first input into a first output signal at the first output, wherein the delay is dependent on the approach or the touch related to the sensor element, and wherein the second signal path comprises an intermediate element, which is configured to change a second output signal at the second output, when the first output signal outputted by the delay device changes.

According to another aspect of the present invention, there is provided a series arrangement comprising at least a first and a second device according to the previous paragraph, wherein the output side of the first device is connected to the input side of the second device. In particular, the first output of the first device is connected to the first input of the second device and the second output of the first device is connected to the second input of the second device.

According to yet a further aspect of the present invention, there is provided a method for detecting an approach or a touch related to at least one sensor element, the method comprising the following steps:
  providing a device with a first input, a first output, a second input and a second output,
  applying a first input signal to the first input,
  applying a second input signal to the second input, resulting in a second output signal at the second output,
  delaying the first input signal into a first output signal, which is fed to the first output, wherein the delay depends on the approach or the touch related to the sensor element,
  changing the second output signal, if the first output signal changes, and
  evaluating the second output signal at the second output.

One concept of the present invention is to represent the approach or the touch related to the sensor element in such a manner that the evaluation and the further processing can be done rather easily. One part of this concept is to send a first input signal along a first signal path and a second input signal along a second signal path. It should be noted that the first and the second input signal may be one and the same signal, or signals that are derived from a common source, or signals where one signal is derived from the other, or signals that are not related in a fixed manner to one another. According to the present invention it is even possible to connect the second input to a fixed potential, in particular ground or a typical voltage source, e.g. +5 V, so that the fixed potential represents the second input signal.

While it is preferred that the signals are related to one another in a defined manner, in particular it is preferred that the signals are sent simultaneously, the following explanations will show that the present invention can be realized using a number of different signal configurations. Further, it is pointed out that even though the use of digital signals is preferred and will, in fact, be in the focus of the preferred embodiments, the invention can also be realized using analog signals.

The first signal path comprises the delay device, which delays a first input signal at the first input into a first output signal, which is fed to the first output. This means that a change of the first input signal at the first input has a time delayed effect on the first output. The delay is chosen in an order of magnitude that can be measured well on the one hand, and on the other hand allows a good distinction between different levels of approach. The delay is preferably chosen to be between 0.1 µs and 1 s, more preferably between 0.5 µs and 50 ms, and most preferably between 1 µs and 1 ms.

The second signal path can feed the second input signal at the second input immediately as a second output signal to the second output. This means, different from the first signal path, that there is no noteworthy delay. Due to the intermediate element in the second signal path, it is provided that the second output signal changes, when the first output signal changes. In other words, the second output signal changes after the first input signal delayed by the delay device is outputted as the first output signal.

One of the functionalities provided by the present invention is the following. As soon as the first input and the second input receive their corresponding input signals, a signal, in particular an edge in the signal, can be detected at the second output, indicating that a signal is provided to the delay device. As soon as the signal has passed the delay device, the second output signal is changed, preferably inverted, so that due to this change at the second output, the time can be determined at which the first input signal was outputted by the delay device as a second output signal.

Based on the time interval detected at the second output, the delay caused by the delay device can be determined and an information related to the approach or the touch related to the sensor element can be determined. The dependency between the delay and the approach is preferably chosen such that an increasing level of approach, meaning the object is closing in, leads to an increasing delay and that a decreasing level of approach, meaning the object is moving away from the sensor element, results in a reduced delay. In addition, it may be preferable that a touch can be detected via an additional increase in delay, in particular in a step-like increase.

According to one refinement of the present invention, the change of the second output signal and the change of the first output signal outputted by the delay device are embodied as an edge, i.e. a rising edge or trailing edge.

This refinement makes it easy to differentiate between the different states of the signals.

According to a further refinement of the present invention, the signals at the input side and the output side are configured as digital signals.

This allows for a rather safe functionality, since the levels for "0"/"low" and "1"/"high" can be chosen with a sufficient distance between the different levels, so that a discrimination between "0" and "1" can be made possible with rather simple components in a reliable manner.

The proposed refinement, in particular in connection with at least two devices arranged in a series arrangement as will be explained further down, is beneficial since along the series of devices only low-impedance digital signals are present. Only at locally very narrow places, in particular the connections between the sensor element and an electronic circuit for implementing the device, high-impedance signals are present.

It is preferred that the connections are rather short. This allows to minimize parasitic influences even before the processing of the output signal or the output signals, which improves the signal quality and detection sensitivity. Further, a flexible arrangement of the individual devices at variable locations is possible. Further, this refinement allows to use a great variety of microcontrollers, since digital inputs are commonly present with microcontrollers.

According to a further refinement of the present invention, the intermediate element is configured as an XOR-element.

Using an XOR-element allows in a rather simple manner to achieve the change of the second output signal, in particular to invert the second output signal when the first output signal changes. This allows to implement the functionality of the second signal path in a cost-efficient manner.

According to a further refinement of the present invention, the delay device comprises a basic delay.

The term "basic delay" is to be understood as a delay that is even present if no object touches or approaches the sensor element. In other words, for different levels of approach there is no delay that is smaller than the basic delay. This refinement can help in improving the accuracy of determining the first point in time at which the first input signal reaches the delay device, and the second point in time at which the delay device outputs the first output signal.

Another opportunity arises to modify the detection sensitivity of the sensor element in a broad range. In this context it is preferred to choose a large basic delay if a more sensitive and far-reaching detection of an approach is desired, and a small basic delay if a less sensitive detection of an approach in a smaller range is desired. The basic delay is also chosen in the previously mentioned magnitude, i.e. preferably between 0.1 µs and 1 s, more preferably between 0.5 µs and 50 ms, and most preferably between 1 µs and 1 ms.

In a further refinement of the present invention, the delay device is configured in that the delay depends on a capacity between the sensor element and a fixed potential, preferably earth or ground.

This allows in a rather straight-forward manner to detect the approach or the touch of an object with a capacitance, which is in particular useful when detecting the presence of a human finger. Preferably, the sensor element represents the capacitance or a part of the capacitance of an RC-member. This can allow for a reliable detection of an approach or a touch which is translated into a time interval according to the present invention.

According to a further refinement of the present invention, the sensor element is configured as an electrode, the electrode in particular partially shielded via a shielding element.

Configuring the sensor element as an electrode can allow for a cost-efficient implementation of the device. If the shielding element is used, in particular as a shielding area, the propagation of the electrical field related to the electrode can be influenced.

If the detection sensitivity range of the electrode is to be increased, the shielding element can be coupled to the first input signal. If two or more devices are used, as will be explained further down, a reduced separation effect between the neighboring sensor elements can be achieved. If, on the other hand, the detection sensitivity is to be reduced or if, when using at least two devices, the separation effect between neighboring sensor elements is to be increased, it is preferred that the coupling of the shielding element to the first input signal comprises an inverter or negator. This provides a dampening effect on the electrode.

According to a further refinement of the present invention, the sensor element is covered by a cover element, wherein the cover element can be pushed against the sensor element and wherein a contact with the sensor element results in a change in capacitance of the sensor element.

This refinement allows, in addition to the detection of an approach or a touch, to provide a tactile feeling like one of a mechanical key. Since a tactile feedback when operating an appliance is an important feature when developing appliances, this refinement takes into account an important request coming from the industry. The cover element is preferably a switch rubber mat, in particular made of silicone, or may be embodied as a tact-switch. A corresponding embodiment of such a device will be explained in the context of the best mode of practicing the invention.

According to a further refinement of the present invention, the device is connected with a further device into a series arrangement, the devices being called first device and second device, subsequently. The output side of the first device is connected to the input side of the second device. In particular, the first output of the first device is connected to the first input of the second device, and the second output of the first device is connected to the second input of the second device.

This refinement underlines one of the special characteristics of the device, namely that a plurality of devices can be arranged in series without the need of having to control and evaluate each device separately. Along the first signal paths a signal is propagated that is being delayed by each device, wherein the signal propagating along the second signal paths can be seen at the second output of the last device, here the second device, almost instantaneously. In a sense, the delays of the individual devices are queried one after the other, wherein each result can be determined based on the signal at the second output of the last device, without the need that the signal along the first signal paths have to arrive at the last device.

The interaction of the devices that is achieved when implementing the present invention will be explained further down in the context of the best mode of practicing the invention.

In a further refinement of the present invention, the input side of the first device is connected to a pulse generator. Preferably both the first input as well as with the second input of the first device are connected to a pulse generator.

This is a rather easy possibility to generate the signal that can be used to query the individual devices of the series arrangement. It is recalled at this time that it is not necessary that the first and second inputs are separate from one another. Rather, it can be sufficient that the input signal of one of the signal paths is derived from the input signal of the other signal path. This will be explained further in the context of a preferred embodiment.

According to a further refinement of the present invention, the output side of a last device in the series arrangement, preferably the second output of the last device, is connected to an evaluation device.

This can allow for a simple and cost-efficient monitoring of all devices in the series arrangement. Based on the changes detected at the second output of the last device, the evaluation device can derive the individual delays of the individual devices. In series arrangement of two devices, the second device is understood to be the last device; in a series arrangement of three devices, the third device is understood to be the last device, and so on.

According to a further refinement of the present invention, the evaluation device is configured to detect a time interval between two edges in the second output signal in order to determine each respective delay caused by each of the delay devices.

The time interval between two edges in the second output signal represents the delay caused by a device. The first time interval represents the delay caused by the first device, the second time interval represents the delay caused by the second device, and so on. Evaluating the edges is particularly useful when choosing a digital implementation for the device.

According to a further refinement of the present invention, the first output of the second device is connected with the input side of the first device in order to create a ring oscillator, wherein the corresponding electrical connection comprises an inverter or negator.

This refinement allows to evaluate a frequency, since the intermediate frequencies that are present at the second output carry information regarding an approach of an object toward the sensor element.

According to a further refinement of the present invention, once the second output signal at the second output has been evaluated, first and second input signals are modified, and a further sequence of sending, delaying, changing and evaluating, as described before, is performed, the now resulting second output signal at the second output is evaluated and a measured value is determined based on the evaluations performed on the bases of the original input signals and of the modified input signals.

This refinement allows for a differential analysis that can be used to improve the measurement accuracy. Preferably, the modified input signal is embodied such that parasitic effects influencing the measurement preferably show up with opposite signs in the original input signal and the modified input signal. This can allow to reduce the influence of parasitic effects, preferably these effects are eliminated.

According to a further refinement of the present invention, the modification of the first input signal is performed by inverting the first input signal.

This refinement allows that parasitic effects from the outside that have an influence on the measurement (e.g. the mains frequency) can be reduced or even eliminated. If, for example, the approach toward the center element is determined based on a charging time of an RC-member, where the sensor element is a part of, applying the original and the inverted input signal results in measuring a charging time and a discharging time, which can both be used in a calculation to determine a more precise measurement result. Preferably, by calculating the average of the charging and discharging times, an effect of a parasitic frequency can be suppressed almost fully. Such allows to perform rather precise and quick measurements, without the need to average a plurality of individual measurements.

According to a further refinement of the present invention, the method further comprises the following steps:

in addition to the first device, providing a second device with a first input, a first output, a second input and a second output, feeding the first output signal of the first device to the first input of the second device, feeding the second output signal of the first device to the second input of the second device, resulting in a second output signal at the second output of the second device, delaying the first input signal of the second device into a first output signal of the second device, which is fed to the first output of the second device, wherein a delay of the second device depends on an approach or a touch related to a sensor element of the second device, and changing the second output signal of the second device, when the first output signal of the second device changes.

It is understood that the features explained before and the features that will be explained further down can be implemented not only in the specific combination but also in other combinations as well as a single feature, while still staying within the spirit and scope of the present invention.

BRIEF DESCRIPTION OF THE DRAWINGS

Preferred embodiments of the invention are shown in the drawings and are explained in the following.

FIG. 1 shows a first embodiment of a device for detecting an approach or a touch related to a sensor element;

FIG. 2 shows a preferred embodiment of a method for detecting an approach or a touch related to a sensor element;

FIG. 3a shows a first preferred embodiment of a series arrangement of three devices;

FIG. 3b shows a second preferred embodiment of a series arrangement of three devices;

DESCRIPTION OF PREFERRED EMBODIMENTS

Figure 4A:
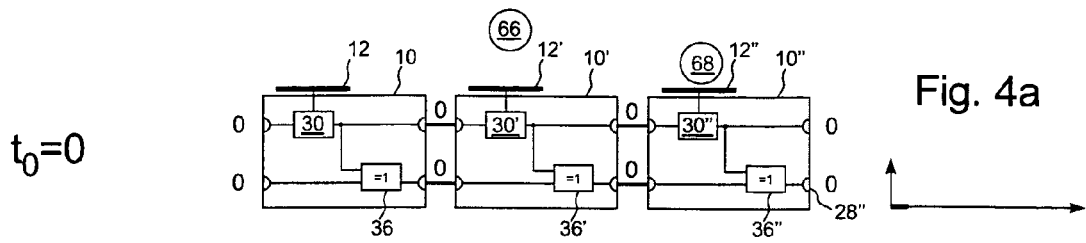
FIGS. 4a-4e show the functionality of a series arrangement of three devices, wherein two objects have approached to different sensor elements at two different levels.

FIG. 1 shows a device 10 for detecting an approach or a touch related to at least one sensor element 12, the device 10 comprising an input side 14 and an output side 16, between which a first signal path 18 is arranged comprising a first input 20 and a first output 22, and a second signal path 24 comprising a second input 26 and a second output 28.

The first signal path 18 comprises a delay device 30 having a delay, the delay device 30 configured to delay a first input signal 32 at the first input 20 into a first output signal 34 at the second output 22. The delay depends on an approach or a touch related to the sensor element 12. The second signal path 24 comprises an intermediate element 36, in order to change a second output signal 40 at the second output 28, when the first output signal 34 outputted by the delay device 30 changes.

The device 10 is configured such that the signals 32, 34, 38, 40 at the input side 14 and at the output side 16 are configured as digital signals. The intermediate element 36 is configured as an XOR-element.

In this embodiment the delay device 30 comprises three elements, namely a first element 42 which provides a predetermined basic delay, a second element 44, which provides the effect of a delay that depends on the approach or the touch related to the sensor element 12, and a third element 46, which digitizes a signal received from the second element 44. The third element 46 is preferably configured as a Schmitt trigger buffer.

It is understood that the delay device 30 can be realized in a number of different ways, wherein preferably the functionality of at least two or all elements is combined in one component. This is particularly useful, if the third element 46 uses a capacitive element for the digitizing step, the element having a basic charging time that can be increased via an approach toward the sensor element 12. This can allow for a cost-efficient implementation of the delay device 30.

The sensor element 12 is configured as an electrode, which is partially shielded by a shielding element 48. The shielding is achieved by connecting the shielding element 48 to the first input 20 via an optional inverter 50.

FIG. 2 shows a preferred embodiment of a method for detecting an approach or a touch related to at least one sensor element 12, the method comprising the following steps:

providing (step S1) a device 10 with a first input 20, a first output 22, a second input 26 and a second output 28, applying (step S2) a first input signal 32 to the first input 20, applying (step S3) a second input signal 38 to the second input 26, resulting in a second output signal 40 at the second output 28, delaying (step S4) the first input signal 32 into a first output signal 34, which is fed to the first output 22, wherein the delay depends on the approach or the touch related to the sensor element 12, changing (step S5) the second output signal 40, when the first output signal 34 changes, and evaluating (step S6) the second output signal 40 at the second output 28.

For an easy implementation, the method continues (step S7) via branch Z1 toward the termination of the method. For an extended measurement, the method continues via branch Z2 to step S8, where the first and the second input signals 32, 38 are modified. Using the modified input signals 32, 38, the steps of applying (steps S2, S3), of delaying (step S4), of changing (step S5) and of evaluating (step S6) are performed again. The method then branches (step S7) via branch Z3 toward step S9, where a measurement value is determined based on the evaluations that have their bases on the original and the modified input signals 32, 38. The method then terminates and can be started again.

It is understood that steps S2 and S3 can be performed in a different sequence. In particular it is possible that step S3 is performed significantly before step S2, in particular if a fixed potential, preferably ground or a specific supply voltage, is to be used as a second input signal 38, in other words to be applied to the second input 26. To determine the delay caused by the delay device 30 in this configuration, the time interval can be determined that passes between applying or sending the first input signal 32 until the resulting reaction at the second output 28 (and also at the first output 22 of the corresponding device 10).

FIGS. 3a and 3b each show a series arrangement 60 of three devices 10, 10', 10". If it is intended to understand the functionality of a series arrangement having only a first device 10 and a second device 10", the following explanations can be read by omitting the explanations in the context of the device 10' in the middle. In the same manner, the device 10' in the middle can be replaced by a series arrangement of a plurality of devices, so that the functionality for a series arrangement of four or more devices 10 can be understood as well. Therefore, the explanations provided in the context of FIGS. 3*a* and 3*b* also provide an understanding for a series arrangement with an arbitrary number of devices 10.

Devices 10, 10', 10" are represented in a simplified manner: The delay devices 30, 30', 30" are now represented as a single component, and sensor element 12 is not shielded.

FIG. 3*a* shows that the first input 20 and the second input 26 of the first device 10 are connected to a pulse generator 62 and that the first output 22 and the second output 28 of the last device 10" are connected to an evaluation device 64.

FIG. 3*b* shows that the first device 10 is connected to a pulse generator 62 only at the first input 20, and that the second input signal 38 for the second signal path 24 is derived from the first signal path 18. Further, in this embodiment, only the second output 28 of the last device 10" is connected to the evaluation device 64, since this is sufficient for practicing the present invention.

Based on FIGS. 4*a* to 4*e* the functionality of the series arrangement 60 is now explained. It is assumed that no object approaches the sensor element 12 of the first device 10, that a first object 66 is present at a larger distance to the sensor element 12' of the middle device 10', and that a second object 68 is present at a smaller distance to sensor element 12" of the last device 10".

In FIG. 4*a* the situation at the point in time $t_0=0$ is shown. At the first and second inputs 20, 26 of the first device 10, no signals are present or, taking another viewpoint, signals representing a digital "0" are present. It can be seen that all inputs and outputs 20, 22, 26, 28, 20', 22', 26', 28', 20", 22", 26", 28" are at "0". As can be seen in the small diagram at the right of the figure, it is noted that the second output 28" of the last device 10" is at "0". The small diagram shows the signal trace over time at the second output 28" of the last device 10".

Figure 4B:
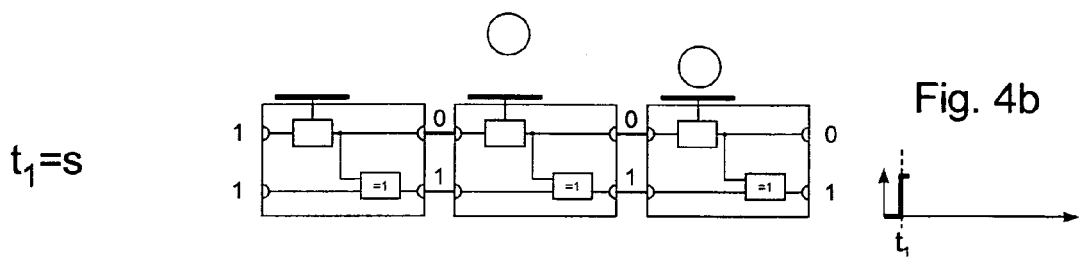

At the point in time $t_1=s$, which is shown in FIG. 4*b*, a signal is applied to first and second inputs 20, 26 of the first device 10, the signal being a digital "1". The first input signal 32 propagates along the first signal path 18 and is delayed by the delay device 30, so that the first output 22 of the first device 10 remains unchanged at "0". The second input signal 38 propagates through all intermediate elements 36, 36', 36" to the second output 28" of the last device 10". Therefore, the level at the second output 28" of the last device 10" changes from "0" to "1". This is shown in the diagram of FIG. 4*b*.

Figure 4C:
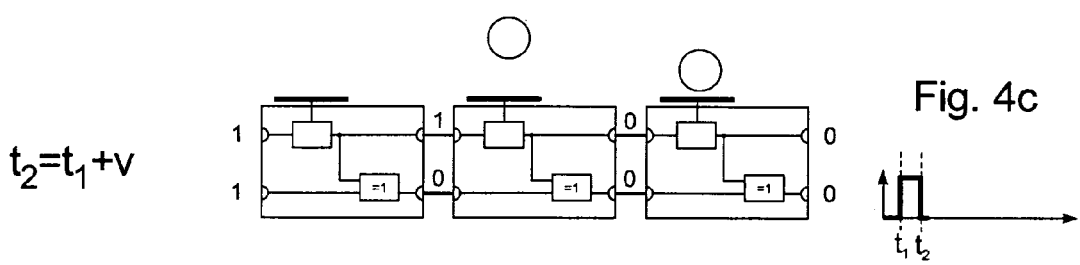

After the delay device 30 has subjected the signal to a delay v, see FIG. 4*c*, the input signal 32 appears as a first output signal 34 at the first output 22 of the first device 10. The delay v represents the basic delay, so that even without an object approaching the sensor element 12, 12', 12", a minimum basic delay v is present. As soon as the first output signal 34 changes from "0" to "1", the second output signal 40 at the second output 28 of the first device 10 is changed by the intermediate element 36 from "1" to "0". This change propagates almost instantaneously to the second output 28" of the last device 10", so that a signal change from "1" to "0" can be detected, see the corresponding diagram.

The signal "1" at the first input 20 of the middle device 10' is now present at the delay device 30' and, due to the delay, is not immediately fed to the first output 22' of the middle device 10'.

Figure 4D:
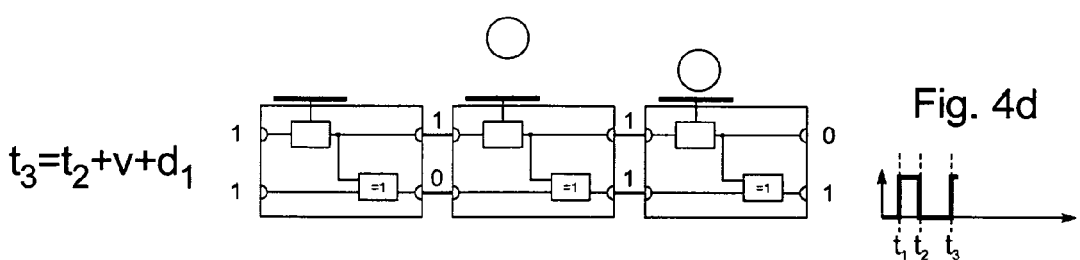

In FIG. 4*d*, the point in time $t_3=t_2+v+d_1$ is shown which is present after the delay device 30' has delayed the signal along the first signal path 18' by a delay of $v+d_1$. The delay $v+d_1$ comprises the basic delay v and a delay value $d_1$, the delay value $d_1$ resulting from the approach of the first object 66 toward the sensor element 12'.

As soon as the delay device 30' feeds the first input signal 32' to the first output 22' of the middle device 10', the state of the second output 28' of the middle device 10' changes from "0" to "1". This change is immediately detectable at the second output 28" of the last device 10", see the corresponding diagram.

As can be taken from the diagram, the time interval from $t_1$ to $t_2$ is smaller than the time interval from $t_2$ to $t_3$. This allows to determine, how much an object has approached a sensor element. Since every edge serves as a trigger for the beginning of the next time interval, e.g. the edge at the point in time $t_2$ represents the end of the time interval from $t_1$ to $t_2$ as well as the beginning of the time interval from $t_2$ to $t_3$, a new time reference is generated for each device 10, 10', 10", so that the measurements can be performed rather precisely.

Figure 4E:
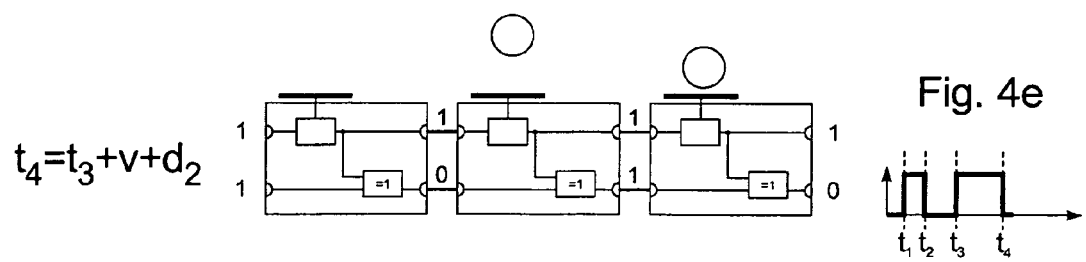

Finally, in FIG. 4*e*, the situation at the point in time $t_4=t_3+v+d_2$ is shown where the delay device 10" has delayed the signal along the first signal path 18" by a delay of $v+d_2$. The delay $v+d_2$ comprises the basic delay v and the delay $d_2$ that is caused by the presence of the second object 68 close to the center element 12". The diagram shows that the delay $v+d_2$ is greater than the delay $v+d_1$, which means that the delay $d_2$ is greater than the delay $d_1$. This again means that the second object 68 is closer to the sensor element 12" than object 66 is to sensor element 12'.

Since the approach of similar objects, in particular a human finger, results within a certain tolerance range to predetermined delays, the measured time intervals or the measured delays can be used to determine the distance of an object to the sensor element. The data required for correlating a delay to a distance can be determined either via calculations and/or via experiments and can be stored preferably as a function or as a table or a characteristic diagram.

Even though already mentioned above, it is pointed out again that the invention allows to arrange a plurality of devices 10 in a series arrangement and to connect them to a single evaluation device 64. Further, it is possible to localize a functional error in this chain, since e.g. if only two edges are detected, even though four edges are expected, this would be an indication that the middle device 10' in a series arrangement of three devices 10, 10', 10" may not be functional.

Figure 5:
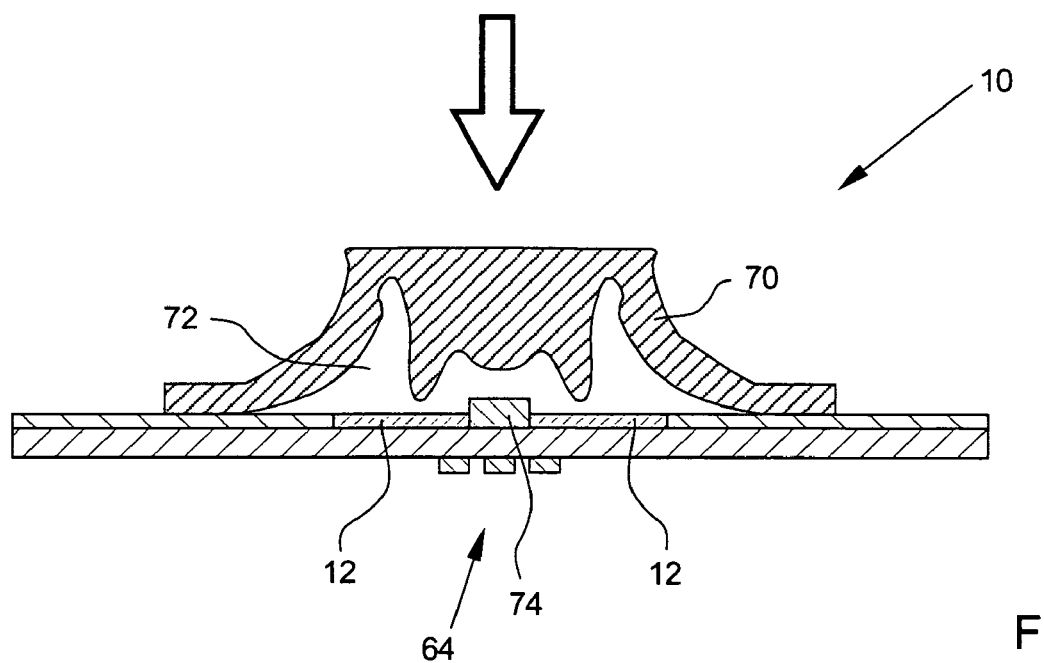
FIG. 5 shows a second preferred embodiment of a device for detecting an approach or a touch related to a sensor element, the device allowing a tactile feedback.

FIG. 5 shows a second preferred embodiment of a device 10 where the sensor element 12 is covered by a cover element 70, here embodied as a switch rubber mat. The cover element 70 is elastic and/or flexible and can be pressed against the sensor element 12 (indicated via the large arrow). The evaluation device 64 detects an approach toward the sensor element 12 as well as a touch on the sensor element 12 via the cover element 70. The cover element 70 is configured such that a touch on the sensor element 12 via the cover element 70 can be detected well, in particular by means of a significant change in capacitance.

When using so-called tact switches for providing a tactile feedback, the switch can be integrated. Preferably, a contact of the switch is connected to the electrode while the other one remains unconnected or is connected via a resistive element with high impedance to a fixed potential, in particular said shielding element.

When switching, there is a step-like change in the capacitance of the electrode which can be reliably detected by the evaluation electronics.

From a manufacturing standpoint, the present invention allows to provide a solution at a similar cost like known solutions using switch rubber mats or switches, while at the same time increasing the functionality by adding a capacitive detection of an approach.

In addition to the benefits mentioned before, the capacitive evaluation of a switching event offers the opportunity to integrate optical elements, since a cavity 72 can be provided between the sensor element 12 and the cover element 70, in which a distribution of light can be obtained. The cover element 70 or the switch rubber mat can be provided using a semi transparent or opal material. The cover element 70 can then be used as a diffusing light guide. It is then possible to provide a light emitting element within the key (electrode), as can be seen from the LED 74 shown in FIG. 5, which is arranged directly under the switch rubber mat and within the area of the electrode and which shines light at the key from behind.

What is claimed:

1. In an electrical appliance, a series arrangement comprising at least first and second devices, each of the devices in the series arrangement for detecting an approach or a touch related to at least one sensor element, each of the devices in the series arrangement comprising a first signal path with a first input and a first output and a second signal path with a second input and a second output, wherein the first signal path comprises a delay device with a delay, the delay device configured to delay a digital first input signal at the first input into a digital first output signal at the first output, wherein the delay is dependent on a capacitance value resulting from the approach or the touch related to the sensor element, and wherein the second signal path comprises an XOR-element, which is configured to generate an edge in a digital second output signal at the second output, when the digital first output signal outputted by the delay device exhibits an edge, and wherein the first output of the first device is connected to the first input of the second device and the second output of the first device is connected to the second input of the second device.

2. The electrical appliance according to claim 1, wherein signals at the second input are configured as digital signals.

3. The electrical appliance according to claim 1, wherein the delay depends on a capacity between the sensor element and a fixed potential, preferably earth or ground.

4. The electrical appliance according to claim 1, wherein the sensor element is configured as an electrode.

5. The electrical appliance according to claim 4, wherein the electrode is partially shielded via a shielding element.

6. The electrical appliance according to claim 1, wherein the sensor element is covered by a cover element, wherein the cover element can be pushed against the sensor element and wherein a contact with the sensor element results in a change in capacitance of the sensor element.

7. The electrical appliance according to claim 1, wherein the first input and the second input of the first device is connected to a pulse generator.

8. The electrical appliance according to claim 1, wherein an output of a last device in the series arrangement is connected to an evaluation device.

9. The electrical appliance according to claim 8, wherein the evaluation device is configured to detect a time interval between two edges in the digital second output signal in order to determine each delay caused by each of the delay devices.

10. The electrical appliance according to claim 1, wherein the first output of the second device is connected with an input of the first device in order to create a ring oscillator, wherein a corresponding electrical connection comprises an inverter.

11. The electrical appliance according to claim 1, wherein at least one of the devices in the series arrangement includes a third signal path.

12. A series arrangement comprising at least first and second devices, each of the devices in the series arrangement for detecting an approach or a touch related to at least one sensor element, each of the devices in the series arrangement comprising an input side and an output side, between which a first signal path with a first input and a first output and a second signal path with a second input and a second output are arranged, wherein the first signal path comprises a delay device with a delay, the delay device configured to delay a first input signal at the first input into a first output signal at the first output, wherein the delay is dependent on the approach or the touch related to the sensor element, and wherein the second signal path comprises an intermediate element, which is configured to change a second output signal at the second output, when the first output signal outputted by the delay device changes, and wherein the output side of the first device is connected to the input side of the second device.

13. The series arrangement according to claim 12, wherein a change of the second output signal and a change of the first output signal outputted by the delay device are each embodied as an edge.

14. The series arrangement according to claim 12, wherein signals at the input side and the output side of each of the first and second devices are configured as digital signals.

15. The series arrangement according to claim 12, wherein the intermediate element is configured as an XOR-element.

16. The series arrangement according to claim 12, wherein the delay device comprises a basic delay.

17. The series arrangement according to claim 12, wherein the delay device is configured such that the delay depends on a capacity between the sensor element and a fixed potential, preferably earth or ground.

18. The series arrangement according to claim 12, wherein the sensor element is configured as an electrode.

19. The series arrangement according to claim 18, wherein the electrode is partially shielded via a shielding element.

20. The series arrangement according to claim 12, wherein the sensor element is covered by a cover element, wherein the cover element can be pushed against the sensor element and wherein a contact with the sensor element results in a change in capacitance of the sensor element.

21. The series arrangement according to claim 12, wherein the input side of the first device is connected to a pulse generator.

22. The series arrangement according to claim 12, wherein the output side of a last device in the series arrangement is connected to an evaluation device.

23. The series arrangement according to claim 22, wherein the evaluation device is configured to detect a time interval between two edges in the second output signal in order to determine each delay caused by each of the delay devices.

24. The series arrangement according to claim 12, wherein the first output of the second device is connected with the input side of the first device in order to create a ring oscillator, wherein a corresponding electrical connection comprises an inverter.

25. The series arrangement according to claim 12, wherein at least one of the devices in the series arrangement includes a third signal path.

26. A method for detecting an approach or a touch related to at least one sensor element, the method comprising the following steps:

providing a device with a first input, a first output, a second input and a second output, applying a first input signal to the first input, applying a second input signal to the second input, resulting in a second output signal at the second output, delaying the first input signal into a first output signal, which is fed to the first output, wherein the delay depends on the approach or the touch related to the sensor element, changing the second output signal, when the first output signal changes, evaluating the second output signal at the second output, providing a further device with a further first input, a further first output, a further second input and a further second output, feeding the first output signal of the device to the further first input of the further device, feeding the second output signal of the device to the further second input of the further device, resulting in a further second output signal at the further second output, delaying the further first input signal of the further device into a further first output signal of the further device, which is fed to the further first output of the further device, wherein a further delay depends on a further approach or a further touch related to a further sensor element, and changing the further second output signal of the further device, when the further first output signal of the further device changes.

27. The method according to claim 26 further comprising the following steps after the step of evaluating the second output signal at the second output:

modifying the first input signal into a modified first input signal, applying the modified first input signal to the first input, applying a second input signal to the second input, resulting in a second output signal at the second output, delaying the modified first input signal into a modified first output signal, which is fed to the first output, wherein the delay depends on the approach or the touch related to the sensor element, changing the second output signal, when the modified first output signal changes, evaluating the second output signal at the second output, and determining a measurement value in consideration of results of the steps of evaluating based on the first input signal and the modified first input signal.

28. The method according to claim 27 wherein the step of modifying the first input signal comprises inverting the first input signal.

29. The method according to claim 26 wherein the step of providing the device includes providing the device with a third input.

* * * * *